United States Patent
Hsu et al.

(10) Patent No.: US 11,551,738 B2
(45) Date of Patent: Jan. 10, 2023

(54) MEMORY DEVICE AND METHOD FOR OPERATING MEMORY DEVICE

(71) Applicant: eMemory Technology Inc., Hsin-Chu (TW)

(72) Inventors: Chia-Jung Hsu, Hsinchu County (TW); Wei-Ren Chen, Hsinchu County (TW); Wein-Town Sun, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 56 days.

(21) Appl. No.: 17/225,116

(22) Filed: Apr. 8, 2021

(65) Prior Publication Data

US 2021/0391010 A1     Dec. 16, 2021

Related U.S. Application Data

(60) Provisional application No. 63/038,895, filed on Jun. 14, 2020.

(51) Int. Cl.
| | | |
|---|---|---|
| *G11C 16/04* | (2006.01) |
| *H01L 27/11519* | (2017.01) |
| *H01L 27/11524* | (2017.01) |
| *G11C 16/08* | (2006.01) |
| *G11C 16/14* | (2006.01) |
| *G11C 16/24* | (2006.01) |
| *G11C 16/26* | (2006.01) |
| *G11C 16/30* | (2006.01) |
| *G11C 11/16* | (2006.01) |

(Continued)

(52) U.S. Cl.
CPC ...... *G11C 11/1675* (2013.01); *G11C 11/1697* (2013.01); *G11C 13/0038* (2013.01); *G11C 13/0069* (2013.01); *G11C 16/0433* (2013.01); *G11C 16/08* (2013.01); *G11C 16/14* (2013.01); *G11C 16/24* (2013.01); *G11C 16/26* (2013.01); *G11C 16/30* (2013.01); *H01L 27/11519* (2013.01); *H01L 27/11521* (2013.01); *H01L 27/11524* (2013.01); *H01L 29/42328* (2013.01)

(58) Field of Classification Search
CPC ..... G11C 16/0433; G11C 16/08; G11C 16/14; G11C 16/24; G11C 16/30; H01L 27/11519; H01L 27/11524
See application file for complete search history.

(56) References Cited

U.S. PATENT DOCUMENTS

| | | | |
|---|---|---|---|
| 7,169,668 B2 * | 1/2007 | Yang | H01L 27/11568 |
| | | | 438/257 |
| 7,244,652 B2 * | 7/2007 | Yang | H01L 27/115 |
| | | | 257/E21.21 |

(Continued)

*Primary Examiner* — Tri M Hoang
(74) *Attorney, Agent, or Firm* — Winston Hsu

(57) ABSTRACT

A memory device includes a well, a poly layer, a dielectric layer, an alignment layer and an active area. The poly layer is formed above the well. The dielectric layer is formed above the poly layer. The alignment layer is formed on the dielectric layer, used to receive an alignment layer voltage and substantially aligned with the dielectric layer in a projection direction. The active area is formed on the well. The dielectric layer is thicker than the alignment layer. A first overlap area of the poly layer and the active area is smaller than a second overlap area of the poly layer and the dielectric layer excluding the first overlap area.

8 Claims, 7 Drawing Sheets

(51) Int. Cl.
*G11C 13/00* (2006.01)
*H01L 27/11521* (2017.01)
*H01L 29/423* (2006.01)

(56) References Cited

U.S. PATENT DOCUMENTS

| | | | | |
|---|---|---|---|---|
| 7,450,424 B2* | 11/2008 | Chou | ................. | H01L 29/7887 |
| | | | | 365/185.24 |
| 7,585,738 B2* | 9/2009 | Yu | ................... | H01L 29/66507 |
| | | | | 438/303 |
| 7,879,706 B2* | 2/2011 | Lai | ................... | H01L 29/66545 |
| | | | | 438/257 |
| 8,362,615 B2* | 1/2013 | Lai | ................... | H01L 27/11568 |
| | | | | 257/754 |
| 8,574,980 B2* | 11/2013 | Mehrad | ............ | H01L 21/28097 |
| | | | | 257/E21.438 |
| 8,735,958 B1* | 5/2014 | Chiang | ................ | H01L 29/513 |
| | | | | 257/E21.309 |
| 9,337,192 B2* | 5/2016 | Jangjian | ............. | H01L 29/0847 |
| 9,614,105 B2* | 4/2017 | Fang | ................. | H01L 21/76224 |
| 9,741,845 B2* | 8/2017 | Disney | ............... | H01L 29/0634 |
| 9,853,039 B1* | 12/2017 | Kang | ............... | H01L 27/11519 |
| 2020/0365722 A1 | 11/2020 | Hsu | | |

* cited by examiner

MEMORY DEVICE AND METHOD FOR OPERATING MEMORY DEVICE

CROSS REFERENCE TO RELATED APPLICATIONS

This application claims priority to provisional Patent Application No. 63/038,895, filed Jun. 14, 2020, and incorporated herein by reference in its entirety.

BACKGROUND OF THE INVENTION

1. Field of the Invention

The invention is related to a memory device and a method for operating the memory device, and more particularly, a memory device including an alignment layer and a method for operating the memory device.

2. Description of the Prior Art

As the demand for data storage increases, the importance of memory device also rises. A common requirement for memory device is to reduce the size of the device for placing more memory units in a limited area. However, based on current technique, at least two wells are needed in a memory device. For example, a current non-volatile memory device can have a select gate and a floating gate, where the select gate can be formed on a first well, and two portions of the floating gate can be respectively formed on the first well and a second well. Since at least two wells are needed for building a memory device, it is a difficult challenge to reduce the memory size.

SUMMARY OF THE INVENTION

An embodiment provides a memory device including a well, a poly layer, a dielectric layer, an alignment layer and an active area. The poly layer is formed above the well. The dielectric layer is formed above the poly layer. The alignment layer is formed on the dielectric layer, used to receive an alignment layer voltage and substantially aligned with the dielectric layer in a projection direction. The active area is formed on the well. The dielectric layer is thicker than the alignment layer. A first overlap area of the poly layer and the active area is smaller than a second overlap area of the poly layer and the dielectric layer excluding the first overlap area.

Another embodiment provides a method for operating a memory device. The memory device includes a well, a first poly layer formed above the well, a second poly layer formed above the well, a dielectric layer formed above the first poly layer, an alignment layer formed on the dielectric layer and substantially aligned with the dielectric layer in a projection direction, a first active area formed on the well, and a second active area formed on the well and below the first poly layer and the second poly layer. The method includes when an erase operation is performed on the memory device, applying a first voltage to a doped region of the first active area, applying a second voltage to a first doped region and a second doped region of the second active area. The first voltage is higher than the second voltage. A voltage difference between the first voltage and the second voltage is smaller than a predetermined voltage.

These and other objectives of the present invention will no doubt become obvious to those of ordinary skill in the art after reading the following detailed description of the preferred embodiment that is illustrated in the various figures and drawings.

DETAILED DESCRIPTION

In order to reduce the size of the memory device, embodiments provide a solution as described below. In the text, when a first element (hereinafter A) is described to be to be disposed or formed on an element B (hereinafter B), it means A can be disposed or formed on the surface of B, or A can be partially or totally embedded inside B. When A is described to be disposed or formed in B, it means A can be embedded inside B. In the text, the term poly can mean polycrystalline silicon. In the text, when a first value (hereinafter X) is described to be substantially equal to a second value (hereinafter Y), the difference of X and Y is not larger than 15% of each of X and Y.

Figure 1:
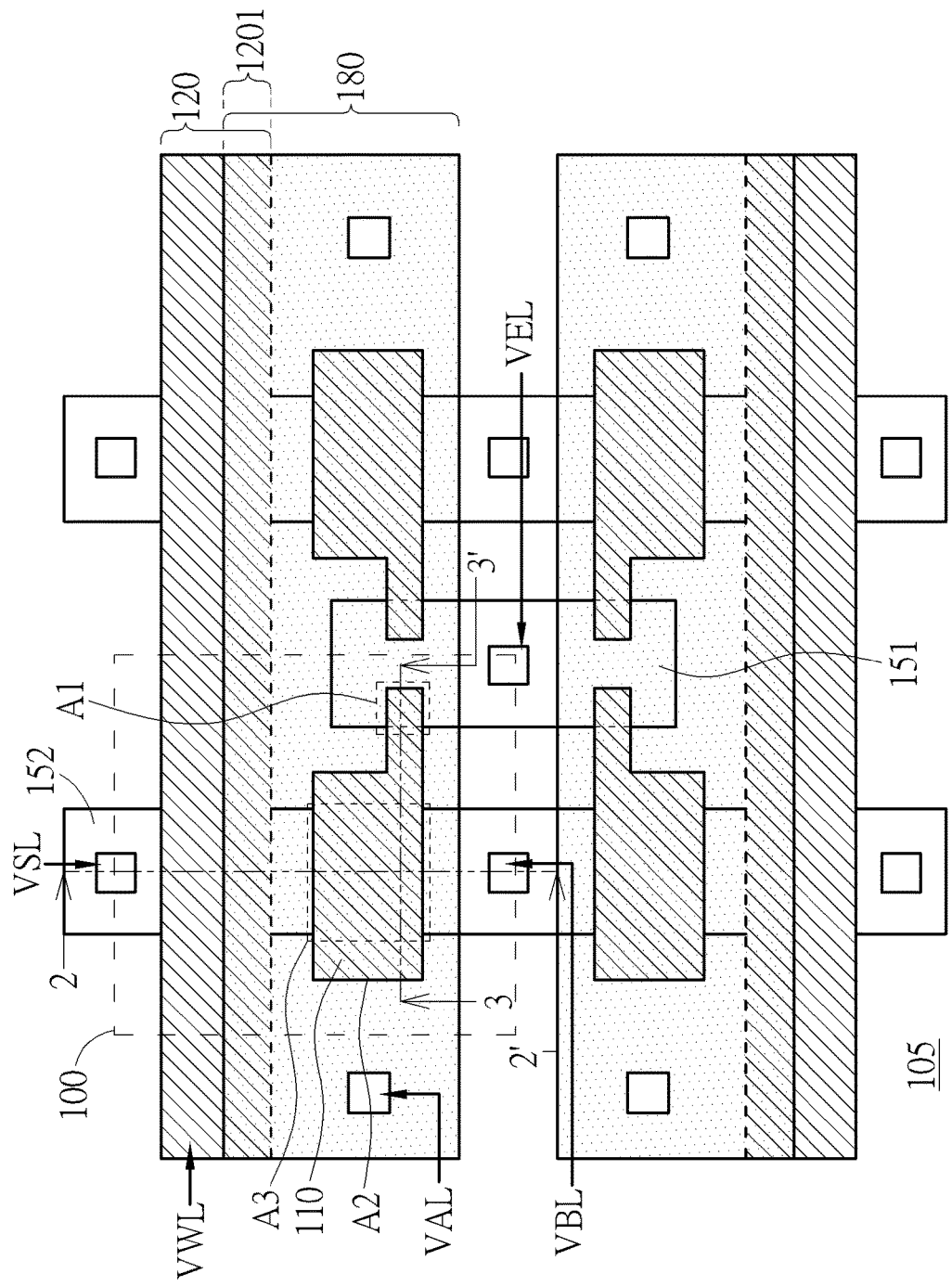
FIG. 1 illustrates a layout including a memory device from a top view according to an embodiment.
Figure 2:
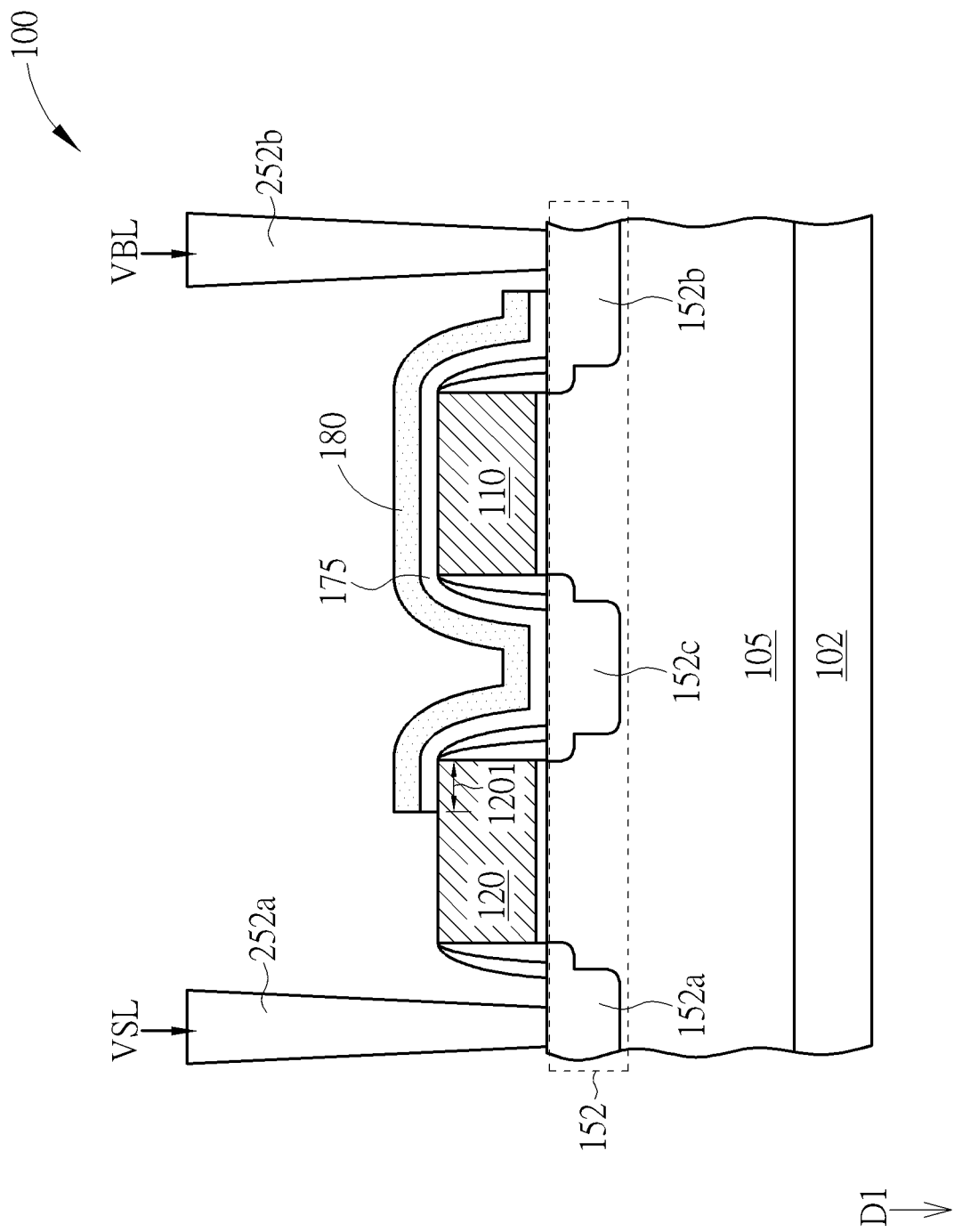
FIG. 2 illustrates a cross-sectional view of the memory device of FIG. 1 along a line 2-2'.
Figure 3:
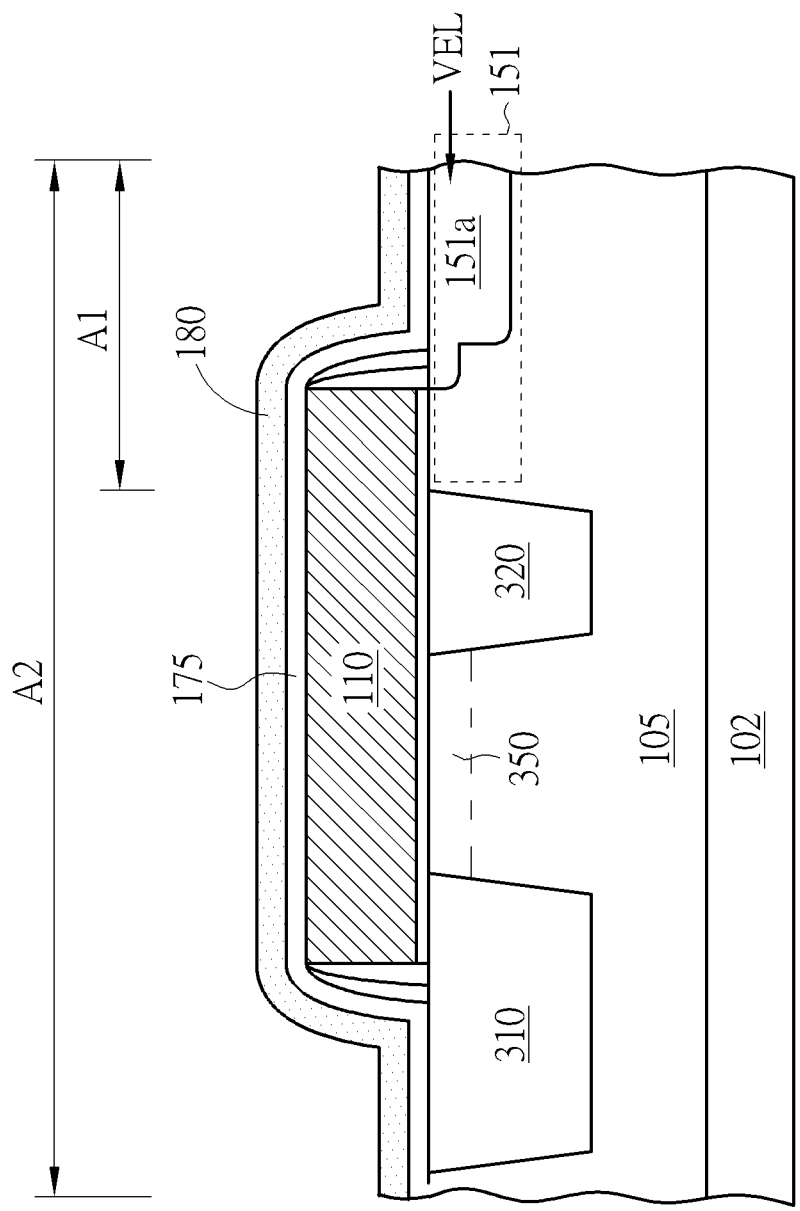
FIG. 3 illustrates another cross-sectional view of the memory device of FIG. 1 along a line 3-3'.

FIG. 1 illustrates a layout including a memory device 100 from a top view according to an embodiment. FIG. 2 illustrates a cross-sectional view of the memory device 100 of FIG. 1 along a line 2-2'. FIG. 3 illustrates a cross-sectional view of the memory device 100 of FIG. 1 along a line 3-3'.

In FIG. 1, four memory devices are shown to illustrate the related layout and the symmetric structure. The memory device 100 is one of the memory devices shown in FIG. 1. Here in the text, only the memory device 100 is described since other memory devices have similar structure and operation principles.

As shown in FIG. 1 to FIG. 3, the memory device 100 can include a well 105, a poly layer 110, another poly layer 120, a dielectric layer 175, an alignment layer 180, an active area 151 and another active area 152.

The well 105 can be formed on a substrate 102. For example, the well 105 can be an n-type well. The poly layer 110 can be formed above the well 105. The dielectric layer 175 can be formed above the poly layer 110. The alignment layer 180 can be formed on the dielectric layer 175, used to receive an alignment layer voltage VAL and substantially aligned with the dielectric layer 175 in a projection direction D1. In other words, the alignment layer 180 and the dielectric layer 175 can cover the same area. The projection direction D1 can be a top view direction. The alignment layer 180 can be a poly layer formed using the same photomask used to form the dielectric layer 175. The dielectric layer 175 can be a resist protection oxide (RPO) layer or a silicide blocking layer (SAB). The active area 151 can be formed on the well 105. An overlap area A1 of the poly layer 110 and the active area 151 is smaller than an overlap area A2 of the poly layer 110 and the dielectric layer 175 excluding the overlap area A1. Moreover, the overlap area A1 of the poly layer 110 and the active area 151 is smaller than an overlap area A3 of the poly layer 110 and the active area 152.

The active area 152 can be formed on the well 105, where the poly layer 110 can be formed above the active area 152. The poly layer 120 can be formed above the well 105 and above the active area 152. As shown in FIG. 1 and FIG. 2, the dielectric layer 175 and the alignment layer 180 can overlap with a part 1201 of the poly layer 120. According to embodiments, the dielectric layer 175 and the alignment layer 180 may not overlap with the poly layer 120; however, the structure can be more stable if the dielectric layer 175 and the alignment layer 180 extend to a proper level. By means of the dielectric layer 175 and the alignment layer 180 overlapping with the poly layer 120, the reliability can be improved without increasing the area of the memory device.

The dielectric layer 175 can be thicker than the alignment layer 180 to prevent the alignment layer 180 from electrically shorting with the poly layer 110. The poly layer 110 and the poly layer 120 each are thicker than the dielectric layer 175. For example, the thickness of the poly layer 110 and the poly layer 120 can be 220 nanometers (nm), the thickness of the dielectric layer 175 can be 100 nm, and the thickness of the alignment layer 180 can be 30 to 40 nm, where the thicknesses are merely examples instead of limiting embodiments.

As shown in FIG. 1 to FIG. 3, the active area 151 can include a doped region 151a of a first conductivity type, and the active area 152 can include a doped region 152a and a doped region 152b of a second conductivity type different from the first conductivity type. For example, the first conductivity type can be N+ type, and the second conductivity type can be P+ type. As shown in FIG. 2, the active area 152 can further include a doped region 152c, and the doped region 152c can be not used to receive an external voltage.

As shown in FIG. 3, under the poly layer 110 (the floating gate layer), two trench isolations 310 and 320 can be formed on the well 105, and a cell channel 350 can be located between the trench isolations 310 and 320. The trench isolations 310 and 320 can be used for reducing electrical interferences and preventing electric current leakage. For example, the trench isolations can be shallow trench isolations (STIs).

With the foresaid structure, the poly layer 110 and the poly layer 120 can respectively be the floating gate layer and the select gate layer of the memory device 100. Regarding the structure and the operation voltages of the memory devices 100, the poly layer 120 can be coupled to a word line and used to receive a word line voltage VWL. The doped region 151a of the active area 151 can be coupled to an erase line and used to receive an erase line voltage VEL. The doped region 152a of the active area 152 can be coupled to a source line and used to receive a source line voltage VSL, and the doped region 152b of the active area 152 can be coupled to a bit line and used to receive a bit line voltage VBL.

In FIG. 2, the via 252a can be electrically connected to the doped region 152a to transmit the source line voltage VSL, and the via 252b can be electrically connected to the doped region 152b to transmit the bit line voltage VBL. In FIG. 1, the small squares can be conductive contacts used for applying voltages.

Regarding the size of the memory device 100, since the memory device 100 includes the alignment layer 180, the abovementioned alignment layer voltage VAL can be applied to the alignment layer 180. When an erase operation is performed, the alignment layer voltage VAL can be set as a predetermined voltage (e.g., zero voltage or a negative voltage), and a voltage difference between the floating gate layer (e.g., the poly layer 110) and the doped region 152b can induce the pulling out of the electrons stored in the floating gate layer. In this way, it is no more required to use an active layer formed in a second well different from the first well for applying the erase line voltage. In other words, according to embodiments, only one well is required instead of two wells. Hence, the size of the memory device can be effectively reduced. Related operations are further described below.

The operation voltages applied to the memory device 100 can be as shown in Table 1 below. The erase line voltage VEL, the source line voltage VSL, the bit line voltage VBL, the word line voltage VWL and the alignment layer voltage VAL mentioned in Table 1 can be described as above and shown in FIG. 1 to FIG. 3. Two or more operations of the erase operation, soft-program operation, program operation and read operation may not be concurrently performed, and merely one operation is performed at a time.

TABLE 1

(the voltages and times in brackets are merely examples instead of limiting embodiments)

|  | Program operation | Erase operation | Soft-program operation | Read operation |
| --- | --- | --- | --- | --- |
| Erase line voltage VEL | V8 (e.g., 8 volts (V)) | V1 (e.g., 16 V) | V10 (e.g., 8 V) | V15 (e.g., 2.4 V) |
| Source line voltage VSL | V6 (e.g., 8 V) | V2 (e.g., 8 V) | V11 (e.g., 8 V) | V16 (e.g., 2.4 V) |
| Bit line voltage VBL | V7 (e.g., 0 V) | V2 (e.g., 8 V) | V12 (e.g., 0 V) | V17 (e.g., 0.4 V) |
| Word line voltage VWL | V9 (e.g., 4 V) | V4 (e.g., 8 V) | V13 (e.g., 8 V) | V18 (e.g., 0 V) |
| Alignment layer voltage VAL | V5 (e.g., a voltage rising from a negative voltage −2 V to 4 V) | V3 (e.g., 0 V or a negative voltage) | V14 (e.g., 4 V) | V19 (e.g., 0 V) |
| Operation time | T1 (e.g., 50 microseconds (usec)) | T2 (e.g., 200 milliseconds (msec)) | T3 (e.g., 50 msec) | — |

The abovementioned erase operation, soft-program operation, program operation and read operation are described below. FIG. 4 to FIG. 7 are related to the method of performing the erase operation, soft-program operation, program operation and read operation.

Figure 4:
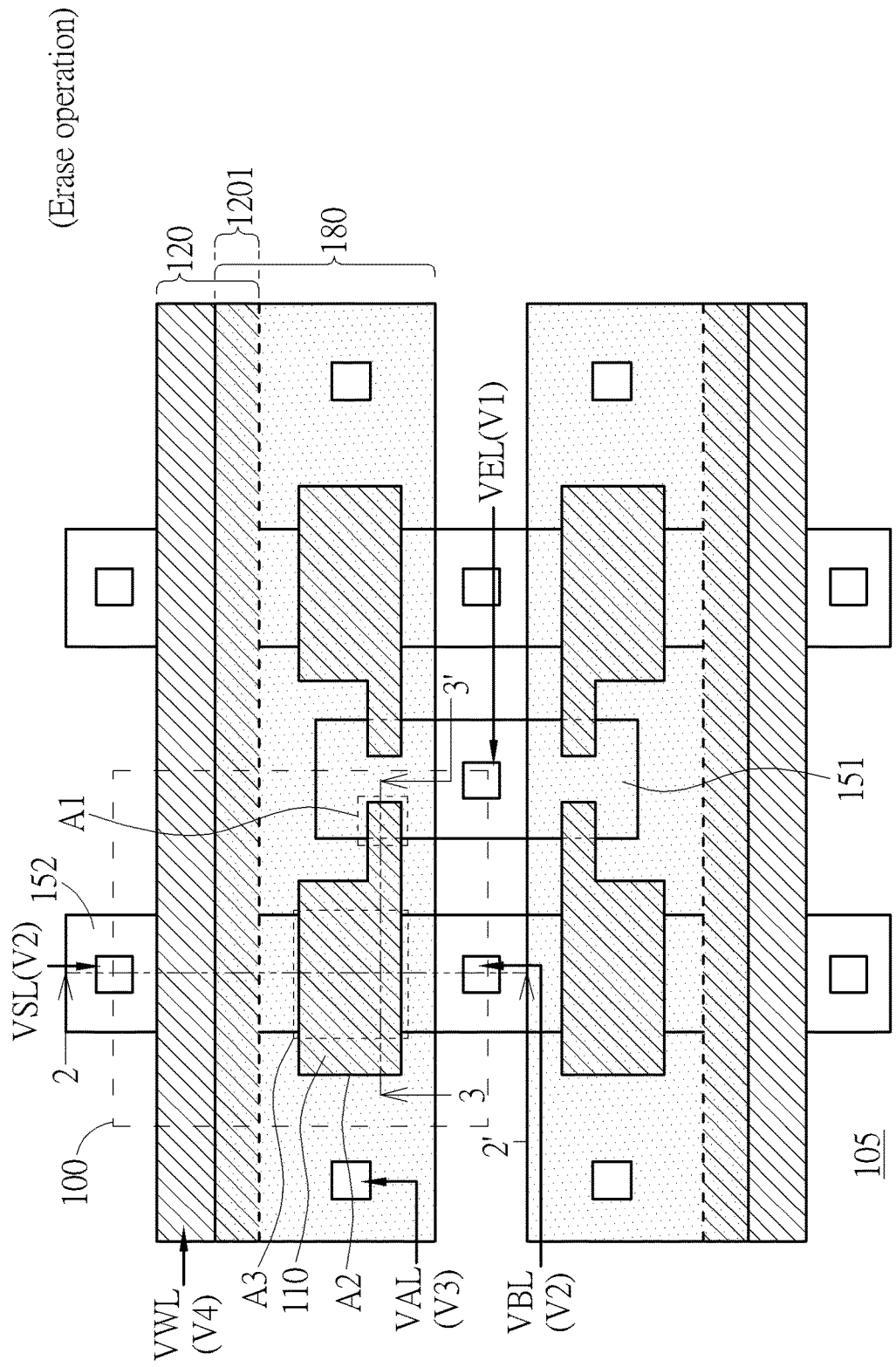
FIG. 4 illustrates the memory device shown in FIG. 1 when an erase operation is performed.

(1) Erase Operation:

FIG. 4 illustrates the memory device 100 shown in FIG. 1 when an erase operation is performed. According to embodiments, the erase operation can be performed using Fowler-Nordheim (F-N) tunneling. Regarding FIG. 1 to FIG. 4 and Table 1, when the erase operation is performed on the memory device 100, the erase line voltage VEL, the source line voltage VSL, the bit line voltage VBL, the word line voltage VWL and the alignment layer voltage VAL can be respectively the voltage V1, the voltage V2, the voltage V2, the voltage V4 and the voltage V3 as shown in Table 1. The voltage V1 can be higher than the voltage V2, and a voltage difference between the voltage V1 and the voltage V2 can be smaller than a predetermined voltage. For example, the predetermined voltage can be a junction breakdown voltage to avoid occurring junction breakdown. The voltage V3 can be a lower voltage as being lower than or equal to a zero voltage. The voltages V2 and V4 can be lower than the voltage V1. Optionally, the voltages V2 and V4 can be substantially equal to one another.

As shown in Table 1, the erase line voltage VEL (e.g., the voltage V1) can be higher to pull up the voltage level of the floating gate layer (e.g., the poly layer 110) through the coupling effect, and the alignment layer voltage VAL (e.g., the voltage V3) can be lower to pull down the voltage level of the floating gate layer through the coupling effect. Because the overlap area A1 of the poly layer 110 and the active area 151 is smaller than an overlap area A2 of the poly layer 110 and the dielectric layer 175 excluding the overlap area A1, so the influence of the alignment layer 180 to the floating gate layer (e.g., the poly layer 110) can be greater than the influence of the active area 151 to the floating gate layer. For example, if a ratio of the overlap area A1 and the overlap area A2 excluding the overlap area A1 is 5 to 95, the erase line voltage VEL (e.g., the voltage V1) is 16 volts, and the alignment layer voltage VAL (e.g., the voltage V3) is 0 volts, the voltage level of the floating gate layer can be calculated as 16 volts*5%+0 volts*95%=0.8 volts.

In this scenario, since the voltage difference (e.g., 15.2 volts) between the erase line voltage VEL (e.g., the voltage V1, 16 volts) and the voltage level of the floating gate layer (e.g., 0.8 volts as calculated above) can be high enough, the electrons stored in the floating gate layer can be pulled out. Hence, the erase operation can be performed without needing a memory structure using two wells.

Regarding the erase operation, a higher voltage (e.g., the voltage V1 shown in Table 1) is applied to the junction of the well 105 as the erase line voltage VEL, a higher bias voltage can be sustained, and leakage can be reduced. The efficiency of the erase operation can be enhanced by using a lower or even negative bias voltage (e.g., the voltage V3 shown in Table 1) as the alignment layer voltage VAL.

Figure 5:
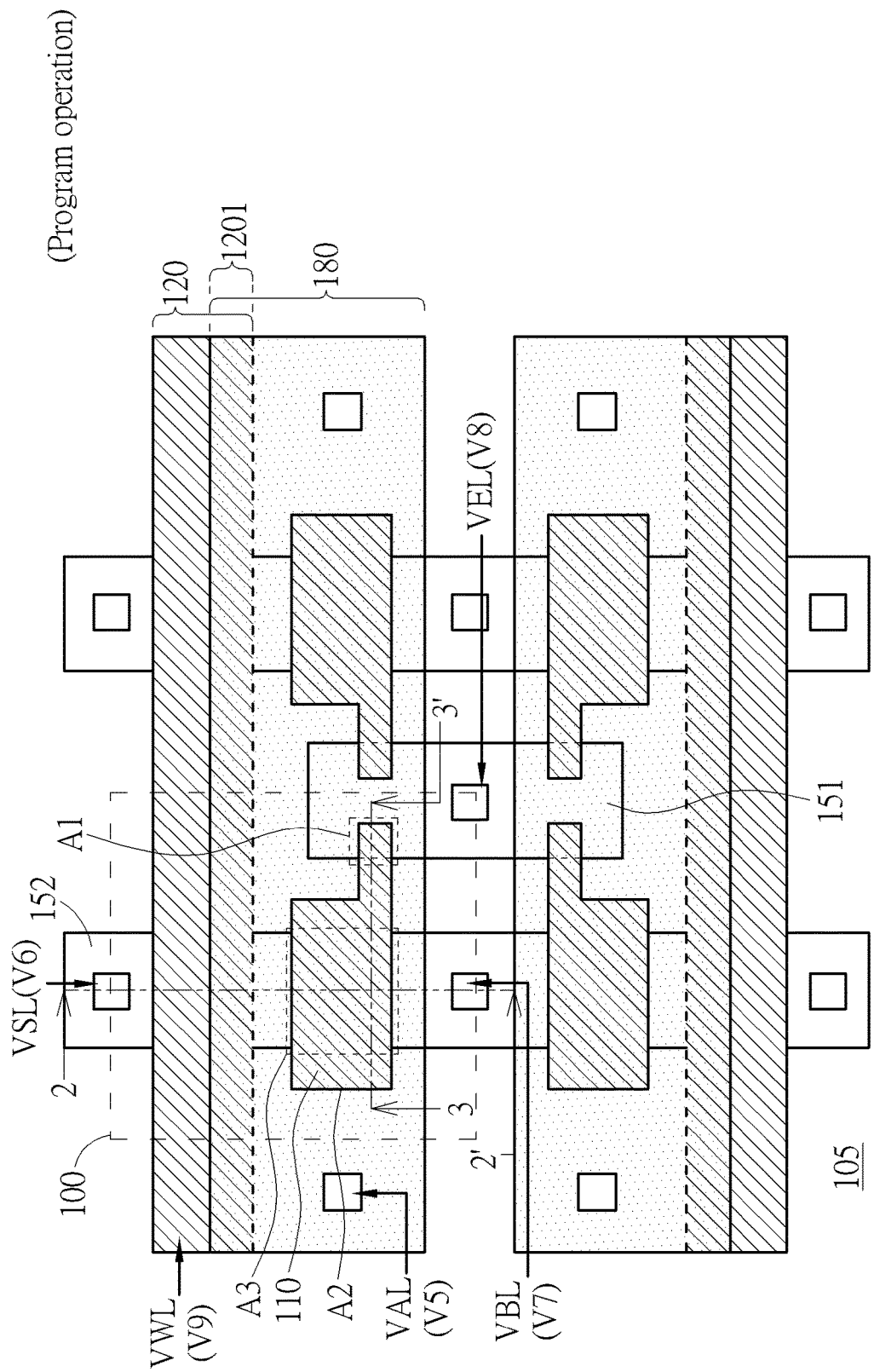
FIG. 5 illustrates the memory device shown in FIG. 1 when a program operation is performed.

(2) Program Operation:

FIG. 5 illustrates the memory device 100 shown in FIG. 1 when a program operation is performed. According to embodiments, the program operation can be performed using channel hot-electron injection (CHEI). Regarding FIG. 1 to FIG. 3, FIG. 5 and Table 1, when the program operation is performed on the memory device 100, the alignment layer voltage VAL can be the voltage V5.

Optionally, the voltages V8 and V6 can be substantially equal to one another. Optionally, the voltages V7, V9 and V5 can be substantially lower than the voltages V8 and V6.

The voltage V5 can rise from a first level (e.g., −2 volts) to a second level (e.g., 4 volts) higher than the first level during the program operation. The voltage V5 can rise gradually or with a stepped waveform.

When the alignment layer voltage VAL is at the first level (e.g., a negative voltage), the channel between the doped region 152a (related to the source line) to the doped region 152b (related to the bit line) can be more conductive to increase the hole-current, and hence more electrons can be generated and moved into the floating gate layer. When the alignment layer voltage VAL rises to the second level, the ability for the floating gate layer to trap electrons can be improved. Hence, by rising the alignment layer voltage VAL, more electrons can be moved into the floating gate layer, and the effect of the program operation can be improved.

When the program operation is performed, the source line voltage VSL can be the voltage V6. The bit line voltage VBL can be the voltage V7. The voltage V6 can be higher than the voltage V7. The voltage difference between the voltage V6 and the voltage V7 should be great enough to accelerate holes to impact the drain side of the equivalent transistor nearby the source line SL which results in generation of electron-hole pairs. For example, the equivalent transistor can be P-type (PNP) transistors. The said equivalent transistor nearby the source line SL can be related to the active area 152 shown in FIG. 2.

When the program operation is performed, the erase line voltage VEL can be the voltage V8. The word line voltage VWL can be the voltage V9. The voltage V8 can be higher than the voltage V9.

Figure 6:
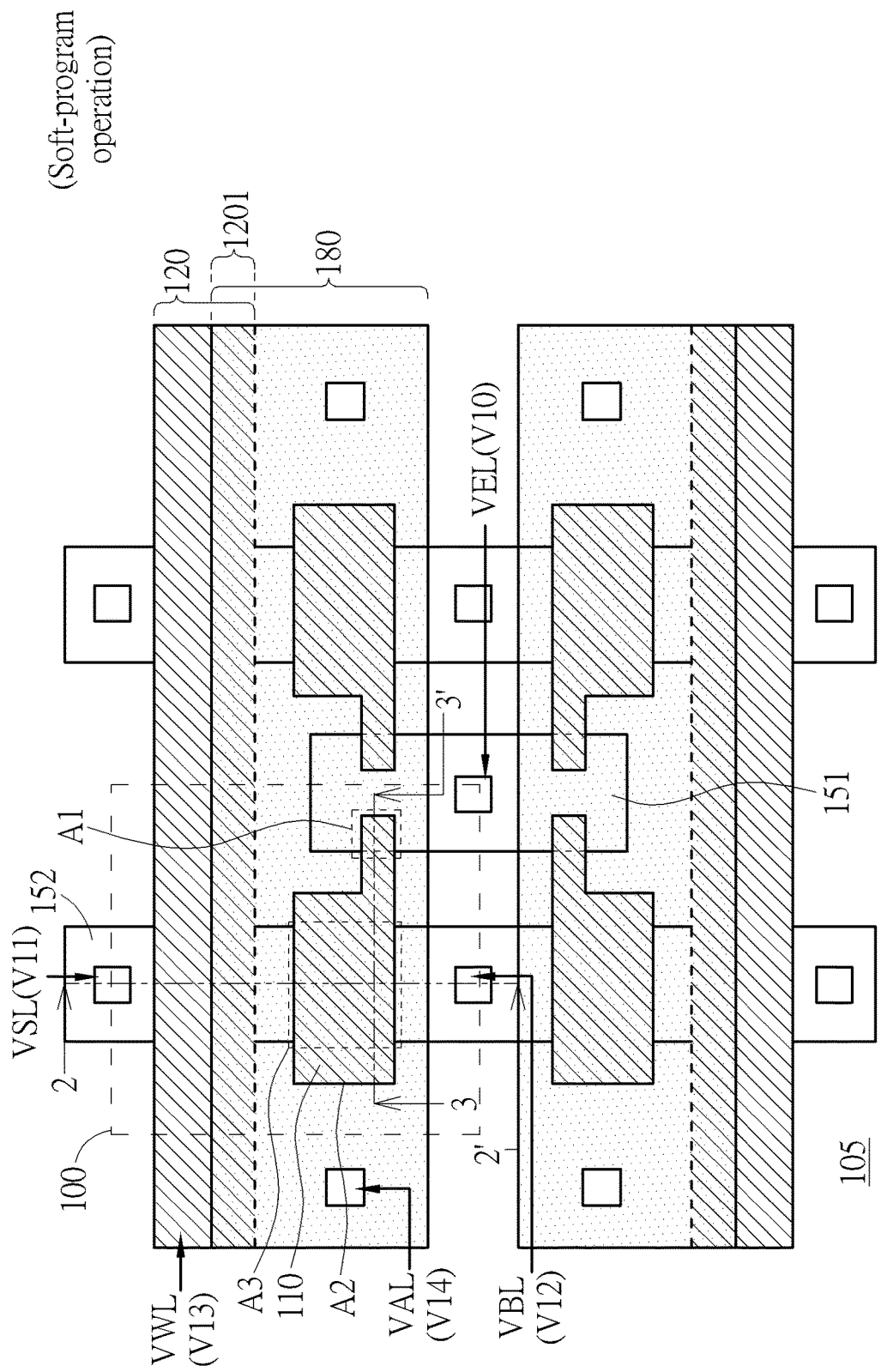
FIG. 6 illustrates the memory device shown in FIG. 1 when a soft-program operation is performed.

(3) Soft-Program Operation:

FIG. 6 illustrates the memory device 100 shown in FIG. 1 when a soft-program operation is performed. The soft-program operation is performed for moving a limited quantity of electrons into the floating gate layer (e.g., the poly layer 110). By means of the soft-program operation, the equivalent transistors related to the active area 152 will not be excessively turned off, and the failure rate of the program operation can be reduced. Hence, the soft-program operation can be similar to the program operation; however, the word line voltage VWL can be adjusted for not turning on the equivalent transistor related to the select gate during the soft-program operation.

Regarding FIG. 1 to FIG. 3, FIG. 6 and Table 1, when the soft-program operation is performed, the erase line voltage VEL, the source line voltage VSL, the bit line voltage VBL, the word line voltage VWL and the alignment layer voltage VAL can respectively be the voltage V10, voltage V11, the voltage V12, the voltage V13 and the voltage V14.

As described in Table 1, the voltage V12 can be lower than the voltages V10, V11, V13 and V14. Optionally, the voltages V10, V11 and V13 can be substantially equal to one another. Optionally, the voltages V12 and V14 can be substantially lower than or equal to the voltages V10, V11 and V13.

Figure 7:
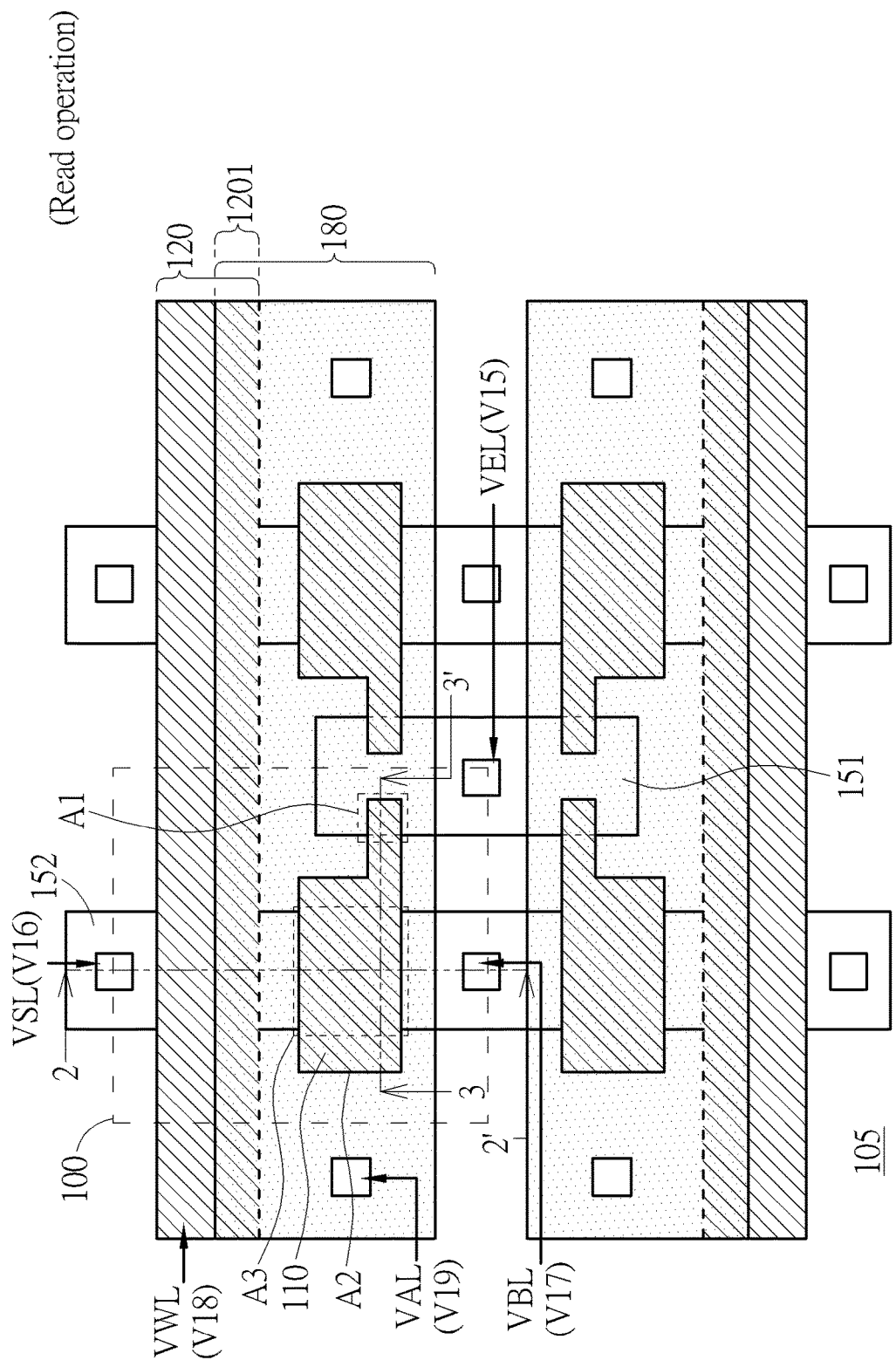
FIG. 7 illustrates the memory device shown in FIG. 1 when a read operation is performed.

(4) Read Operation:

FIG. 7 illustrates the memory device 100 shown in FIG. 1 when a read operation is performed. The applied voltages of the program operation can be similar to but lower than that of the program operation. As shown in FIG. 1 to FIG. 3, FIG. 7 and Table 1, when the read operation is performed, the erase line voltage VEL, the source line voltage VSL, the bit line voltage VBL, the word line voltage VWL and the alignment layer voltage VAL can respectively be the voltage V15, the voltage V16, the voltage V17, the voltage V18 and the voltage V19. The voltages V15 and V16 can be higher than the voltage V17. The voltages V18 and V19 can be lower than or equal to the voltage V17. Optionally, the voltages V15 and V16 can be substantially equal to one another. Optionally, the voltages V18 and V19 can be substantially equal to one another.

Regarding the read operation, the bias voltage applied on the alignment layer 180 can modulate the read current regardless the voltage is positive, zero or negative.

In summary, by means of the alignment layer 180 formed on the dielectric layer 175, the alignment layer voltage VAL can be applied, and the erase, program, soft-program and read operations can be performed on the memory device 100, where the memory device 100 is formed on merely one well 105 instead of two wells. Since only one well is required, the area of the memory device 100 can be effectively reduced. The alignment layer 180 and the dielectric layer 175 can be formed using the same photomask in the manufacture process, so no extra photomask is needed, and the manufacture cost can be effectively controlled. Since the embodiments provide the memory device 100 with smaller area and the method for operating the memory device 100, it is helpful to deal with the long standing problems in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device comprising:
a well;
a first poly layer formed above the well;
a dielectric layer formed above the first poly layer;
an alignment layer formed on the dielectric layer, configured to receive an alignment layer voltage and being substantially aligned with the dielectric layer in a projection direction; and
a first active area formed on the well;
wherein the dielectric layer is thicker than the alignment layer, and a first overlap area of the first poly layer and the first active area is smaller than a second overlap area of the first poly layer and the dielectric layer excluding the first overlap area.

2. The memory device of claim 1, further comprising:
a second active area formed on the well;
wherein the first poly layer is formed above the second active area, and the first overlap area of the first poly layer and the first active area is smaller than a third overlap area of the first poly layer and the second active area.

3. The memory device of claim 2, further comprising:
a second poly layer formed above the well and above the second active area.

4. The memory device of claim 3, wherein the dielectric layer and the alignment layer overlap with a part of the second poly layer.

5. The memory device of claim 3, wherein the second poly layer is configured to receive a word line voltage.

6. The memory device of claim 3, wherein the first poly layer and the second poly layer each are thicker than the dielectric layer.

7. The memory device of claim 2, wherein the first active area comprises a doped region of a first conductivity type, and the second active area comprises a first doped region and a second doped region of a second conductivity type different from the first conductivity type.

8. The memory device of claim 7, wherein the doped region of the first active area is configured to receive an erase line voltage, the first doped region of the second active area is configured to receive a source line voltage, and the second doped region of the second active area is configured to receive a bit line voltage.

* * * * *